US007967916B2

(12) United States Patent
Yun et al.

(10) Patent No.: US 7,967,916 B2
(45) Date of Patent: Jun. 28, 2011

(54) METHOD OF PREVENTING PATTERN COLLAPSE DURING RINSING AND DRYING

(75) Inventors: Seokmin Yun, Pleasanton, CA (US); John M. deLarios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 225 days.

(21) Appl. No.: 12/048,412

(22) Filed: Mar. 14, 2008

(65) Prior Publication Data
US 2009/0229637 A1    Sep. 17, 2009

(51) Int. Cl.
*B08B 3/00* (2006.01)
*B08B 5/04* (2006.01)
(52) U.S. Cl. ............. 134/26; 134/21; 134/30; 134/95.2; 134/99.1; 134/902
(58) Field of Classification Search ............ 134/26, 134/30, 39; 430/322–331
See application file for complete search history.

(56) References Cited

U.S. PATENT DOCUMENTS
6,660,459 B2 * 12/2003 Babcock .............. 430/325
2003/0075204 A1 * 4/2003 de Larios et al. .......... 134/21
2004/0069319 A1 * 4/2004 Boyd et al. .............. 134/1.3
2005/0250054 A1 * 11/2005 Chang .................. 430/329
2008/0314422 A1 * 12/2008 O'Donnell et al. ....... 134/94.1

FOREIGN PATENT DOCUMENTS
JP    2003178943 A  *  6/2003

OTHER PUBLICATIONS
English Machine Translation of JP 2003-178943. Jun. 27, 2003. pp. 1-19.*

* cited by examiner

*Primary Examiner* — Michael Cleveland
*Assistant Examiner* — Nicole Blan
(74) *Attorney, Agent, or Firm* — Martine Penilla & Gencarella, LLP

(57) ABSTRACT

A system and method for preventing a pattern formed on a substrate from collapsing during a rinsing and drying phase of a fabrication operation includes determining a plurality of process parameters associated with a rinsing chemistry used during the rinsing operation. The process parameters define the characteristics of the rinsing chemistry and a substrate surface layer. A chemistry to reduce the surface tension of the rinsing chemistry (surface tension reducer) with at least one low surfactant chemical is identified based on the process parameters of the rinsing chemistry. The surface tension reducer is applied to the surface of the substrate such that the low surfactant chemical reduces the surface tension of the rinsing chemistry applied to the surface of the substrate thereby preventing the pattern from collapsing.

14 Claims, 4 Drawing Sheets

METHOD OF PREVENTING PATTERN COLLAPSE DURING RINSING AND DRYING

FIELD OF THE INVENTION

The present invention relates generally to semiconductor substrate processing, and more particularly, to a method for preventing pattern collapse during rinsing and drying phases of a fabrication operation.

DESCRIPTION OF THE RELATED ART

With the desire to increase productivity and functionality, the semiconductor industries have been packing more and more features onto smaller and smaller areas of an Integrated Circuit (IC) chip. With the continuing trend in increasing the density of the features, the feature sizes are being reduced to accommodate more and more features onto the IC chip. The decrease in feature size leads to delicate features that have a potential of getting damaged during various fabrication process operations. One such damage that the features experience is pattern collapse or distortion.

Pattern collapse or distortion may occur due to various factors. One of the main factors is imbalance in the forces acting on features exacerbated by the surface tension of chemicals used during the rinsing and drying phases of the fabrication operation. The unbalanced force can cause toppling of feature walls, thereby resulting in either a destroyed feature or a feature that is rendered inoperable due to pattern collapse. FIGS. 1 and 2 illustrate an example of pattern collapse during a rinse and dry operation after a conventional rinsing chemical has been applied to the surface of the substrate.

A surface of a substrate 100 with a feature having a plurality of patterns 110-1, 110-2, 110-3, 110-4, 110-5, is shown. A rinsing chemistry 120, such as de-ionized water, is applied to the surface of the substrate 100 during rinsing operation to remove impurities, such as excess chemicals, polymer residues, etc., left behind by earlier fabrication operations. The earlier fabrication operations may include operations, such as chemical deposition, photolithography, etching, chemical-mechanical polishing, etc., that were used to form the patterns. Typically, the rinsing chemistry 120 is applied to portions of the substrate at a given time with all the portions of the substrate eventually exposed to the rinsing chemistry. In the embodiment illustrated in FIG. 1, the application of rinsing chemistry 120 proceeds from right to left with areas between patterns 110-5, 110-4 and between 110-4, 110-3 initially exposed to the rinsing chemistry 120. The presence of rinsing chemistry 120 on one side of the pattern 110-5 and the lack of any liquid on the other side of pattern 110-5 creates an unbalanced force to act on the pattern 110-5. The imbalance in the force is further exacerbated by the surface tension of the rinsing chemistry 120. The rinsing operation is then followed by a drying operation. During the drying operation, the unbalanced force acting on the pattern 110-5 will cause the pattern 110-5 to collapse on pattern 110-4. As can be seen in FIG. 1, the arrows within the trenches between the patterns, 110-5-110-4, 110-4-110-3, 110-3-110-2, and 110-2-110-1, show the direction of the force acting on the corresponding patterns due to the presence of the rinsing chemistry 120. The adhesive and cohesive forces due to the surface tension of the rinsing chemistry further increase the unbalanced forces acting on the patterns. If the size of the features (110-1 through 110-5) were significant, the features may have been able to withstand the unbalanced force. However, with the feature sizes shrinking, the delicate features are unable to withstand the unbalanced force.

FIG. 2 illustrates the sequence of pattern collapse during drying operation. As the drying operation proceeds from right to left, the unbalanced force due to the presence/absence of rinsing chemistry 120 on either side of the patterns also proceed from right to left. The surface tension of the rinsing chemistry 120 further increases the unbalanced force acting on the patterns forcing pattern 110-5 to collapse on to pattern 110-4, pattern 110-4 to collapse on to pattern 110-3 and pattern 110-3 to collapse on to pattern 110-2. The collapsed patterns 110-5 through 110-3 render the associated feature inoperable. The pattern collapse, thus, causes damage to some of the features formed on the substrate resulting in lower yield as parts of the substrate may have to be scrapped.

One of the goals of an effective fabrication process is to minimize pattern collapse. One way of minimizing or avoiding pattern collapse is by maintaining larger features. However, as mentioned above, with the current trend of shrinking features onto smaller and smaller areas of chips, maintaining larger feature sizes become impractical. In order to increase the percentage of yield and to get a good return-on-investment (ROI), it is desirable to provide alternate solutions that prevent pattern collapse during the rinsing and drying operations.

SUMMARY

The present invention fills the need by providing an improved method and apparatus for preventing pattern collapse using proximity technology. It should be appreciated that the present invention can be implemented in numerous ways, including an apparatus and a method. Several inventive embodiments of the present invention are described below.

In one embodiment, a method for preventing a pattern collapse on a substrate during a rinsing and drying phase of a fabrication operation is disclosed. The method includes determining a plurality of process parameters associated with a rinsing chemistry applied during a rinsing operation. The process parameters define the characteristics of the rinsing chemistry, including surface tension of the rinsing chemistry, and of a surface layer of the substrate over which the patterns are defined. A chemistry to reduce the surface tension of the rinsing chemistry (surface tension reducer) is identified based on the process parameters associated with the rinsing chemistry. The surface tension reducer includes a low surfactant chemical that reduces the surface tension of the rinsing chemistry. The surface tension reducer is applied to the surface of the substrate during rinsing chemistry application such that the low surfactant chemical reduces the surface tension of the rinsing chemistry applied to the substrate thereby preventing the pattern from collapsing.

In another embodiment of the invention, a system to prevent a pattern collapse on a substrate during a rinsing and drying operation is disclosed. The system includes a substrate supporting device to receive, support and transport the substrate through the system and a proximity head that is configured to introduce a chemistry to reduce the surface tension of the rinsing chemistry (surface tension reducer), to a surface of the substrate during rinsing chemistry application. The introduction of the surface tension reducer reduces the surface tension of a meniscus of rinsing chemistry formed on the surface of the substrate such that the surface tension reducer preserves the pattern formed on the surface of the substrate.

Other aspects and advantages of the invention will become more apparent from the following detailed description, taken in conjunction with the accompanying drawings, illustrating by way of example the present invention.

BRIEF DESCRIPTION OF THE DRAWINGS

The invention may best be understood by reference to the following description taken in conjunction with the accompanying drawings. These drawings should not be taken to limit the invention to the preferred embodiments, but are for explanation and understanding only.

DETAILED DESCRIPTION

Figure 1:
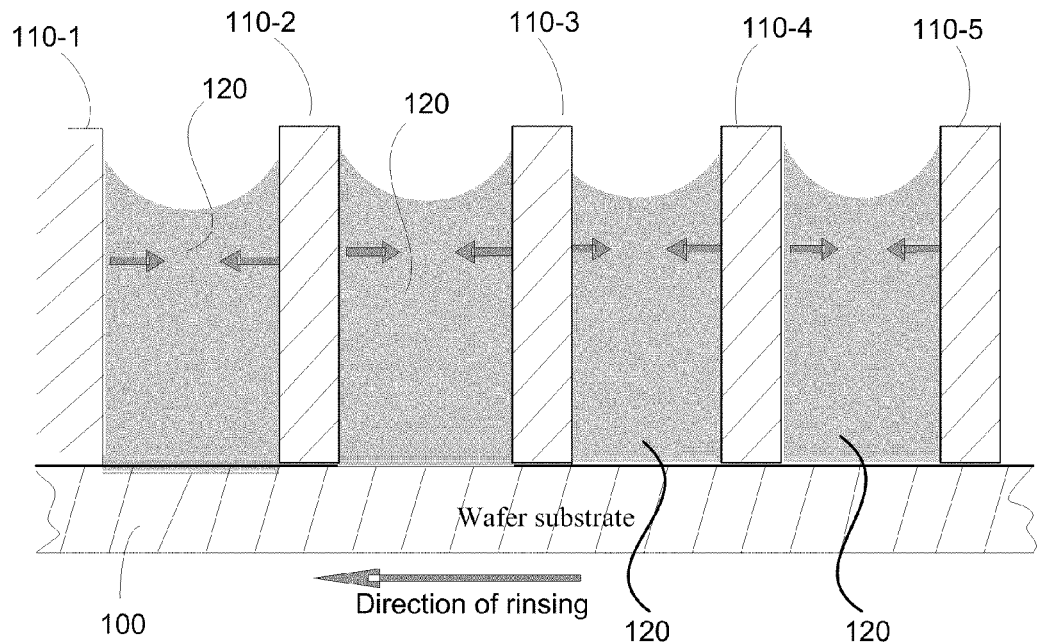
FIG. 1 is a schematic cross-sectional view of a substrate during a rinsing and drying operation, in accordance to a prior art method.

Several embodiments for an improved and effective prevention of pattern collapsing on a substrate will now be described. It will be obvious, however, to one skilled in the art, that the present invention may be practiced without some or all of these specific details. In other instances, well known process operations have not been described in detail in order not to unnecessarily obscure the present invention.

Delicate patterns etched on a surface of a substrate are prone to damage or distortion during various fabrication operations. With the current trend of reduced feature size and increased density of features on an IC chip, preserving the delicate patterns from collapsing poses a significant challenge. With more and more features being packed onto the IC chip, the solution of limiting feature size is becoming impractical. It is, therefore, advantageous in finding an alternate solution for preserving the patterns.

Effective treatment to preserve the patterns formed on the substrate is very important in order to maintain the quality and functionality of the resulting semiconductor products, e.g., microchips. In an embodiment of the invention, a chemistry to reduce the surface tension of the rinsing chemistry (surface tension reducer), with a low surfactant is used to treat rinsing chemistry applied to a surface of the substrate such that the surface tension of the rinsing chemistry applied on the surface of the substrate is substantially reduced, thereby minimizing damage to the patterns formed on the surface of the substrate. The selection and application of the surface tension reducer is determined by a plurality of process parameters that define the characteristics of the rinsing chemistry used during the rinsing operation. The application of the low surfactant surface tension reducer to the surface of the substrate mitigates the damage caused by the surface tension of the rinsing chemistry. The lower surface tension results in substantial reduction in the adhesive and cohesive forces of the rinsing chemistry, thereby reducing the unbalanced forces acting on the patterns formed on the substrate. These unbalanced forces when left unmitigated would cause the collapse of the patterns during a drying cycle.

The surface tension reducer is applied at the end of a rinsing operation so that the surface tension on the surface of the substrate is reduced prior to the substrate undergoing a drying operation. The benefits of using the low surfactant surface tension reducer at the end of the rinsing cycle are two folds. Firstly, the majority of the rinsing operation is left unhindered so as to provide optimal rinsing of the substrate. Mixing low-surfactant surface tension reducer with the rinsing chemistry at the beginning of the rinsing operation may sometimes result in ineffective rinsing. By introducing the surface tension reducer at the end of the rinsing cycle, substantial rinsing of the substrate would have already been performed leading to an optimally clean substrate. Secondly, the collapsing of the pattern occurs during the drying cycle when the rinsing chemical is allowed to evaporate causing the unbalanced forces due to adhesive and cohesive forces of the rinsing chemistry to act on the patterns. By using low surfactant surface tension reducer at the end of the rinsing cycle, the surface tension caused by the rinsing chemical is substantially reduced so that substantial damage to the patterns is avoided. The reduced surface tension of the rinsing chemistry leads to reduced adhesive and cohesive forces acting on the patterns during the rinsing and drying cycle, thereby preventing the patterns from collapsing.

FIG. 1 illustrates a schematic cross-sectional view of patterns 110 on the surface of the substrate 100 during a rinsing cycle. The patterns may be formed using fabrication operations, such as deposition, photolithography, etching, etc. The patterns may be, for example, electrical connections that connect to an underlying metal layer or dielectric trenches. A rinsing chemistry 120 is applied during the rinsing operation to portions of the substrate. As can be seen in FIG. 1, the rinsing chemistry fills the areas between some of the patterns formed on the substrate such as, the area between patterns 110-5, 110-4 and 110-4, 110-3 exposing the area to the rinsing chemistry so as to act on residues left behind by earlier fabrication operations substantially removing them.

Figure 2:
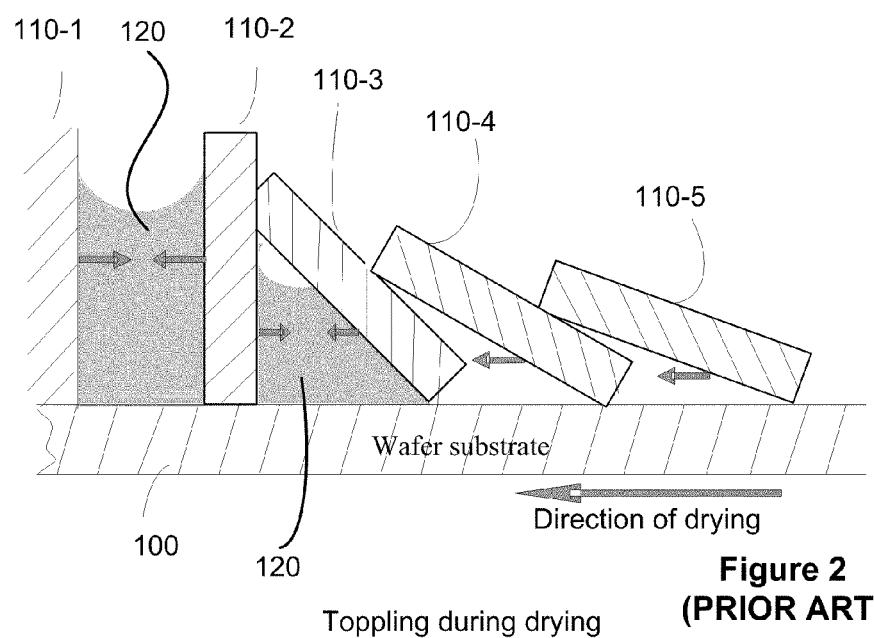
FIG. 2 is a schematic cross-sectional view of a substrate illustrating a pattern collapse during a rinsing and drying operation of the prior art method.

The surface tension of the applied rinsing chemistry causes sufficient unbalanced forces, such as adhesive and cohesive forces associated with the rinsing chemistry, to act on the patterns. FIG. 2 illustrates the effect of the unbalanced forces, due to adhesive and cohesive forces of the rinsing chemistry, on the patterns during rinsing and drying operations. As shown, these unbalanced forces cause some of the patterns to collapse resulting in damage to the features formed on the substrate. As shown in FIG. 2, due to the unbalanced forces, pattern 110-5 collapses on pattern 110-4 which in turn collapses on to pattern 110-3 as the drying operation proceeds from right to left. For instance, if the patterns were electrical connections to the underlying metal layer, the collapse of the pattern would cause metal disconnects to the underlying metal layer resulting in damaged or inoperable features. FIGS. 1 and 2 illustrate a structure of a very simple feature formed on the substrate. With the increased number of features packed onto the substrate, pattern collapse such as the one discussed above would cause substantial yield loss of IC chips during the fabrication operation. It is advantageous to address the issue of pattern collapse in order to increase the yield.

Figure 3:
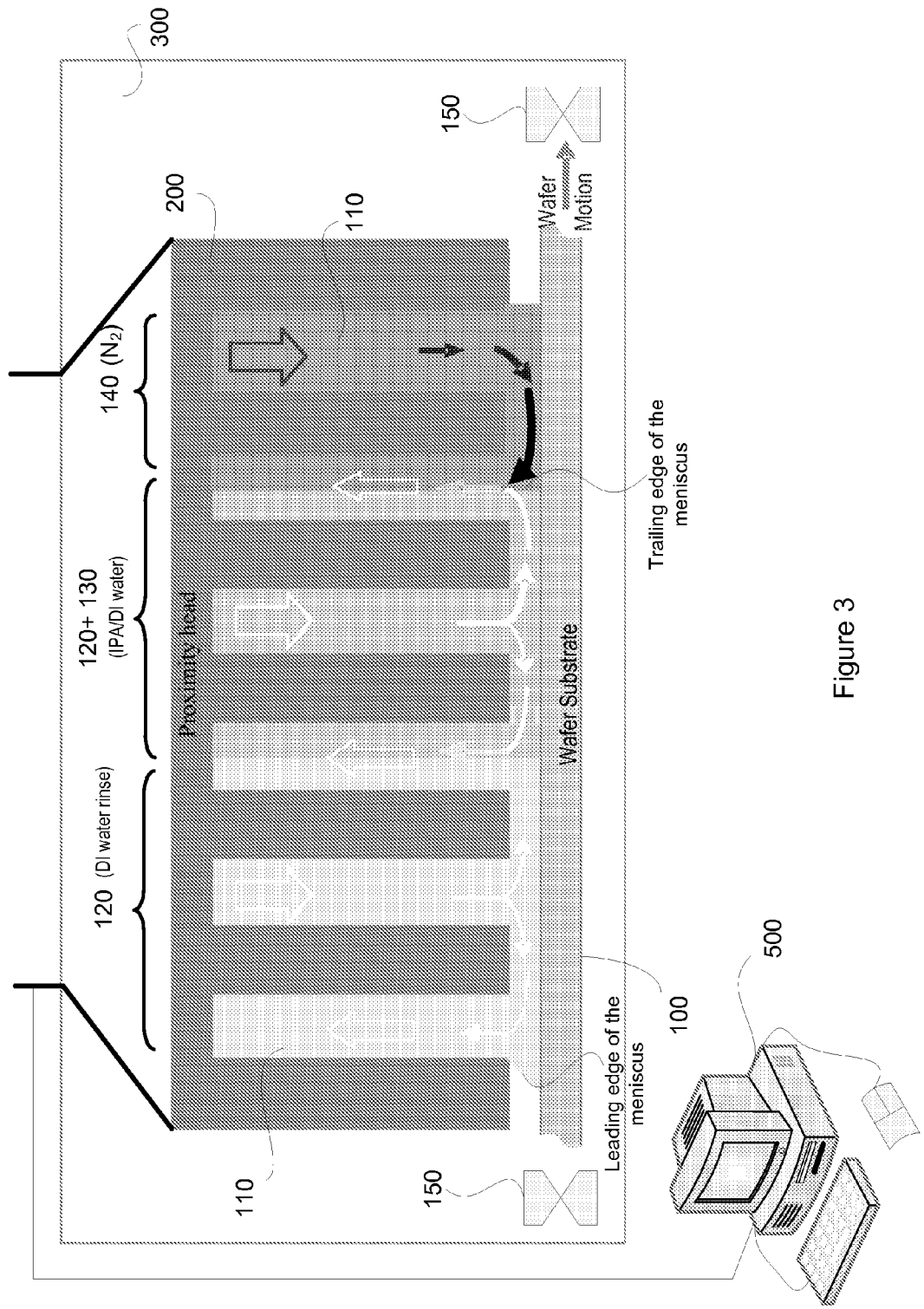
FIG. 3 is schematic cross-sectional view of a rinsing chamber, according to one embodiment of the invention.

FIG. 3 illustrates a system used to introduce a chemistry to reduce the surface tension of the rinsing chemistry (surface tension reducer) to a surface of the substrate to substantially reduce surface tension of the rinsing chemistry applied to the surface of the substrate thereby preventing patterns from collapsing, in one embodiment of the invention. The system includes a housing chamber 300 having a substrate supporting device 150 and a proximity head 200 to control the delivery of the surface tension reducer to the surface of the substrate during rinsing chemistry application. The substrate 100 is introduced into the housing chamber 300 through a substrate input region (not shown) and is removed from a substrate output region (not shown). The substrate supporting device 150 receives the substrate through the substrate input region, transports the substrate 100 through the proximity head 200 and delivers the substrate at the substrate output region. The substrate supporting device 150 is any type of device that is capable of receiving, supporting and transporting the substrate on a selected plane. One example substrate supporting device is a wafer carrier, such as the one described in U.S. patent application Ser. No. 11/743,516, entitled "HYBRID COMPOSITE WAFER CARRIER FOR WET CLEAN EQUIPMENT", filed on May 2, 2007, and assigned to the Assignee of the subject application and is incorporated herein by reference.

In the embodiment illustrated in FIG. 3, a single proximity head 200 is used in introducing surface tension reducer 130 to the surface of the substrate 100 to prevent patterns from collapsing. Although the embodiment is shown using a single proximity head, the invention is not restricted to a single proximity head but can include a plurality of proximity heads. As shown in FIG. 3, the proximity head 200 includes a plurality of inputs and outputs to apply and remove rinsing chemistry, surface tension reducing fluid and drying gas, such as nitrogen, from the substrate of the substrate. The rinsing chemistry is applied to the surface of the substrate as a rinsing chemistry meniscus using a first set of inputs 125. The surface tension reducer 130 is introduced by the proximity head 200 through a second set of inputs 125 immediately along side the rinsing chemistry meniscus being applied at the surface of the substrate and the application of the surface tension reducing fluid (surface tension reducer) is controlled based on a plurality of process parameters associated with the rinsing chemistry 120 and corresponding film layer formed on the surface of the substrate over which the patterns are formed. A drying gas is applied by the proximity head immediately along side the surface tension reducing fluid through a third set of inputs 125. The term, "meniscus," as used herein, refers to a volume of liquid bounded and contained in one or more regions on the surface of the substrate in part by surface tension of the liquid. The meniscus is controllable and can be moved over a surface in a contained shape so that regions of the substrate are exposed to the rinsing chemistry and the surface tension reducer applied to the surface of the substrate. In specific embodiments, the meniscus is maintained by the delivery of fluids to a surface while also removing the fluids so that the meniscus remains controllable. Furthermore, the meniscus shape can be controlled by precision fluid delivery and removal systems that may further include a computing system. A plurality of outputs 135 in the proximity head are configured to remove the rinsing chemistry and the surface tension reducer at a fluid interface. In one embodiment, the surface tension reducer mixes with the rinsing chemistry and are removed through the outputs 135. In one embodiment, the surface tension reducer and drying gas, such as Nitrogen, are removed through the outputs 135 at the application interface 138 between the surface tension reducer and the drying gas. In one embodiment, a first set of outputs 135 are used to remove the rinsing chemistry and a second set of outputs 135 are used to remove the rinsing chemistry and the surface tension reducer at the fluid interface. Similarly, a third set of outputs 135 may be used to remove the surface tension reducer and the drying gas at the interface 138 between the surface tension reducer and the drying gas. Thus, as shown in FIG. 3, the substrate is moved under the proximity head in a direction that exposes regions of the substrate surface first to the rinsing chemistry, second to the surface tension reducer and third to the drying gas, such as nitrogen flow, such that the exposed regions of the substrate surface are substantially dry when exiting the region under the proximity head. In one embodiment, the operations of applying the rinsing chemistry, surface tension reducer and the drying gas are performed simultaneously so that as the substrate moves under the proximity head so that the application of the fluids/gas operate on the exposed regions consecutively with the exposure to the rinsing chemistry being first and the exposure to the drying gas being last.

The selection and application of the surface tension reducer 130 is based on a plurality of characteristics associated with a rinsing chemistry 120 defined by the plurality of process parameters. The process parameters are obtained by analyzing the rinsing chemistry 120 applied to the surface of the substrate 100 and the type and nature of material on the surface of the substrate over which the patterns are formed. Some of the process parameters that are considered when choosing appropriate surface tension reducer 130 may include type, pressure, temperature, and concentration of the rinsing chemistry 120, type, thickness, and nature of film layer on the surface of the substrate over which the patterns are formed. The process parameters associated with the rinsing chemistry may vary from one substrate to the next. It is essential to preserve the film layer formed on the surface of the substrate during the rinsing and drying operation so that the functionality of the patterns is maintained. The selected surface tension reducer 130 is applied at the end of the rinsing operation using the proximity head 200 so as to substantially reduce the surface tension of the rinsing chemistry 120 prior to the drying operation. Examples of the surface tension reducer 130 are provided below in Table 1.

TABLE 1

Sample chemistry to reduce the surface tension of the rinsing chemistry (surface tension reducer) used in preventing Pattern collapse: Surface Chemistry based on material and rinsing chemistries used:

| Surface material Composition | Rinsing Chemistry Used | Surface tension reducerUsed |
|---|---|---|
| 1. Si, SiO2, SiN | DI water | Liquid IPA |
| 2. Si, SiO2, SiN | None | Liquid IPA |
| 3. Si, W, Al | DI water | DI water, hydro fluorocarbon based surfactant (HFE) 0.05% |
| 4. Si, W, Al | None | DI water, Liquid IPA 50% |

To assist in the lowering of the surface tension of the rinsing chemistry, the surface tension reducer includes at least a chemical with low surfactant. In one embodiment of the invention, the surface tension reducer includes a low surfactant liquid chemical such as liquid isopropyl alcohol (IPA). Additionally, proprietary chemicals with low surfactant such as 3M™ Hydrofluoroether (HFE) 7100 may be used in place of the IPA. In another embodiment, the surface tension reducer includes a mixture of de-ionized water (DI water) and liquids that have lower surfactant, such as IPA. The percentage of DI water in the mixture can be between about 20% to about 80% with an optimum condition at about 50%. In yet another embodiment, the surface tension reducer includes a mixture of low surfactants such as hydro fluorocarbon based surfactants in DI water. In one embodiment, a proprietary hydro fluorocarbon based chemical such as DuPont's Zonly™ surfactants may be used to effectively lower surface tension of the rinsing chemistry. The concentration of the hydro fluorocarbon based chemical may be between about 0.001% to about 0.1% with an optimum condition at about 0.05%. In a further embodiment, a mixture of DI water and gas may be used to reduce the surface tension of the rinsing chemistry. For instance, the gas may include any one or combination of Nitrogen, Oxygen, Carbon dioxide or inert gases such as Helium, Neon, Argon and Xenon. The percentage of the gas in DI water may be between about 20% to about 80% with an optimum condition at about 50%. In a further embodiment of the invention, high density IPA vapor may be added to the Nitrogen mixture to obtain the low surfactant surface tension reducer. The percentage of IPA vapor in this mixture may be between about 30% to about 90% with an optimum condition at about 50%.

For additional information with respect to the proximity head, reference can be made to an exemplary proximity head, as described in the U.S. Pat. No. 6,616,772, issued on Sep. 9, 2003 and entitled "METHODS FOR WAFER PROXIMITY CLEANING AND DRYING." This U.S. patent, which is assigned to Lam Research Corporation, the assignee of the subject application, is incorporated herein by reference.

For additional information about top and bottom menisci, reference can be made to the exemplary meniscus, as disclosed in U.S. patent application Ser. No. 10/330,843, filed on Dec. 24, 2002 and entitled "MENISCUS, VACUUM, IPA VAPOR, DRYING MANIFOLD." This U.S. patent, which is assigned to Lam Research Corporation, the assignee of the subject application, is incorporated herein by reference.

For additional information about menisci, reference can be made to U.S. Pat. No. 6,998,327, issued on Jan. 24, 2005 and entitled "METHODS AND SYSTEMS FOR PROCESSING A SUBSTRATE USING A DYNAMIC LIQUID MENISCUS," and U.S. Pat. No. 6,998,326, issued on Jan. 24, 2005 and entitled "PHOBIC BARRIER MENISCUS SEPARATION AND CONTAINMENT." These U.S. patents, which are assigned to the assignee of the subject application, are incorporated herein by reference in their entirety for all purposes.

For additional information about the proximity vapor clean and dry system, reference can be made to an exemplary system described in the U.S. Pat. No. 6,488,040, issued on Dec. 3, 2002 and entitled "CAPILLARY PROXIMITY HEADS FOR SINGLE WAFER CLEANING AND DRYING." This U.S. patent, which is assigned to Lam Research Corporation, the assignee of the subject application, is incorporated herein by reference.

Referring back to FIG. 3, the computing system 500, running software, is communicatively connected to the proximity head 200 through a fluid delivery control mechanism (not shown). The fluid delivery control mechanism may be located within or outside the housing chamber 300. The fluid delivery control mechanism is used to control the supply of rinsing and surface tension reducer to the proximity head 200 and may include separate reservoirs to store the rinsing chemistry and surface tension reducer, respectively. The delivery of the rinsing chemistry and surface tension reducer may be controlled using delivery controls in the fluid delivery control mechanism. The software in the computing system 500 may be used to manipulate the delivery controls such that proper amount of surface tension reducer is applied at an appropriate stage of the rinsing cycle. A plurality of input parameters associated with the surface tension reducer is used to manipulate the delivery controls based on the process parameters of the rinsing chemistry. Some of the input parameters of the surface tension reducer that may be considered for manipulation include quantity of flow, concentration of the surface tension reducer, temperature, pressure, application start time and duration of application. The computing system 500 may be any standard computing device with an input module to receive the input parameters and display module to display the process and input parameters.

Figure 4:
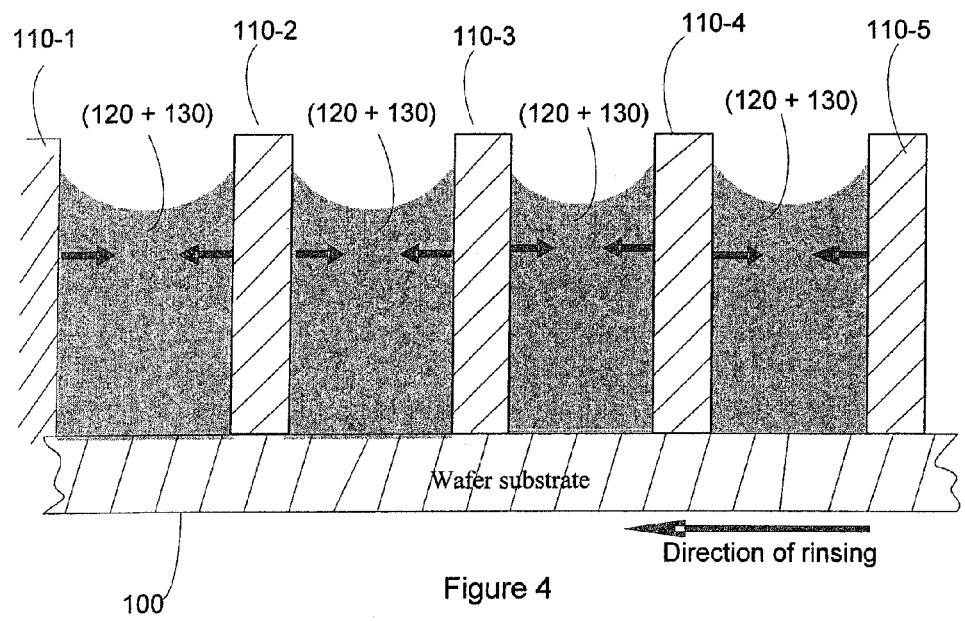
FIG. 4 is a schematic cross-sectional view of a substrate using a chemistry to reduce the surface tension of the rinsing chemistry, according to one embodiment of the invention.
Figure 5:
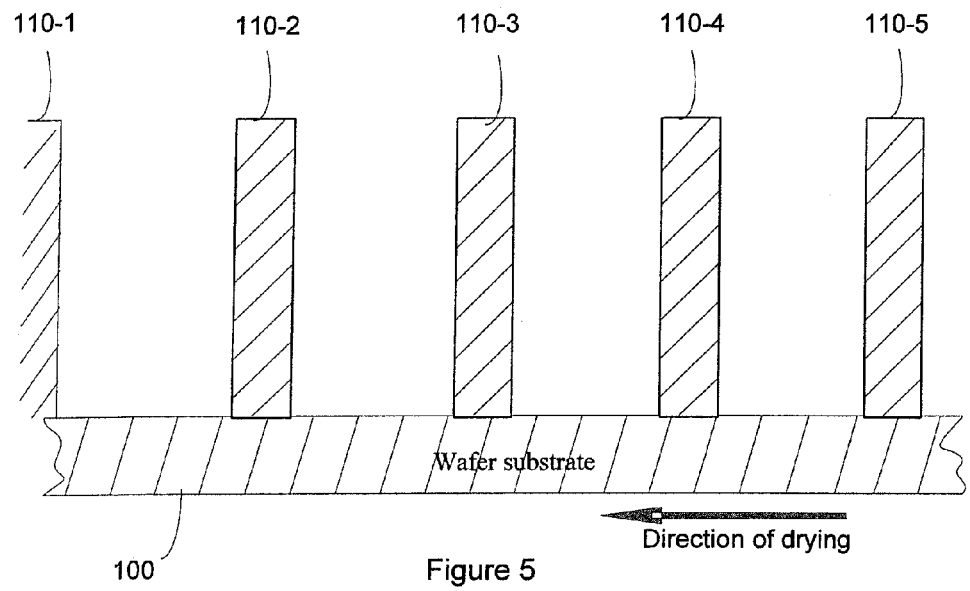
FIG. 5 is a schematic cross-sectional view of a substrate after drying operation, in one embodiment of the invention.

FIGS. 4 and 5 illustrate the schematic cross-sectional view of a portion of the substrate 100 over which patterns 110 were formed, during rinsing and drying operation, respectively. As illustrated in FIG. 4, the gaps between the patterns 110 are treated with the rinsing chemistry 120 so that the areas around the patterns 110 are cleaned during a rinsing phase. Appropriate surface tension reducer 130 with low surfactant is selected based on the process parameters associated with the rinsing chemistry 120 and the substrate surface over which the patterns are formed. The selected surface tension reducer 130 is applied to the substrate 100 at the end of the rinsing cycle so as to substantially reduce the surface tension of the rinsing chemistry 120. The reduced surface tension of the rinsing chemistry 120 leads to a weakening of the adhesive and cohesive forces associated with the rinsing chemistry 120, thereby reducing the unbalanced forces acting on the patterns. The reduction in the unbalanced forces associated with the rinsing chemistry 120 prevents the patterns 110 from collapsing during the drying operation, as illustrated in FIG. 5. Thus, by using low surfactant surface tension reducer 130, the patterns 110 formed on the substrate are substantially preserved during the rinsing and drying operations.

Figure 6:
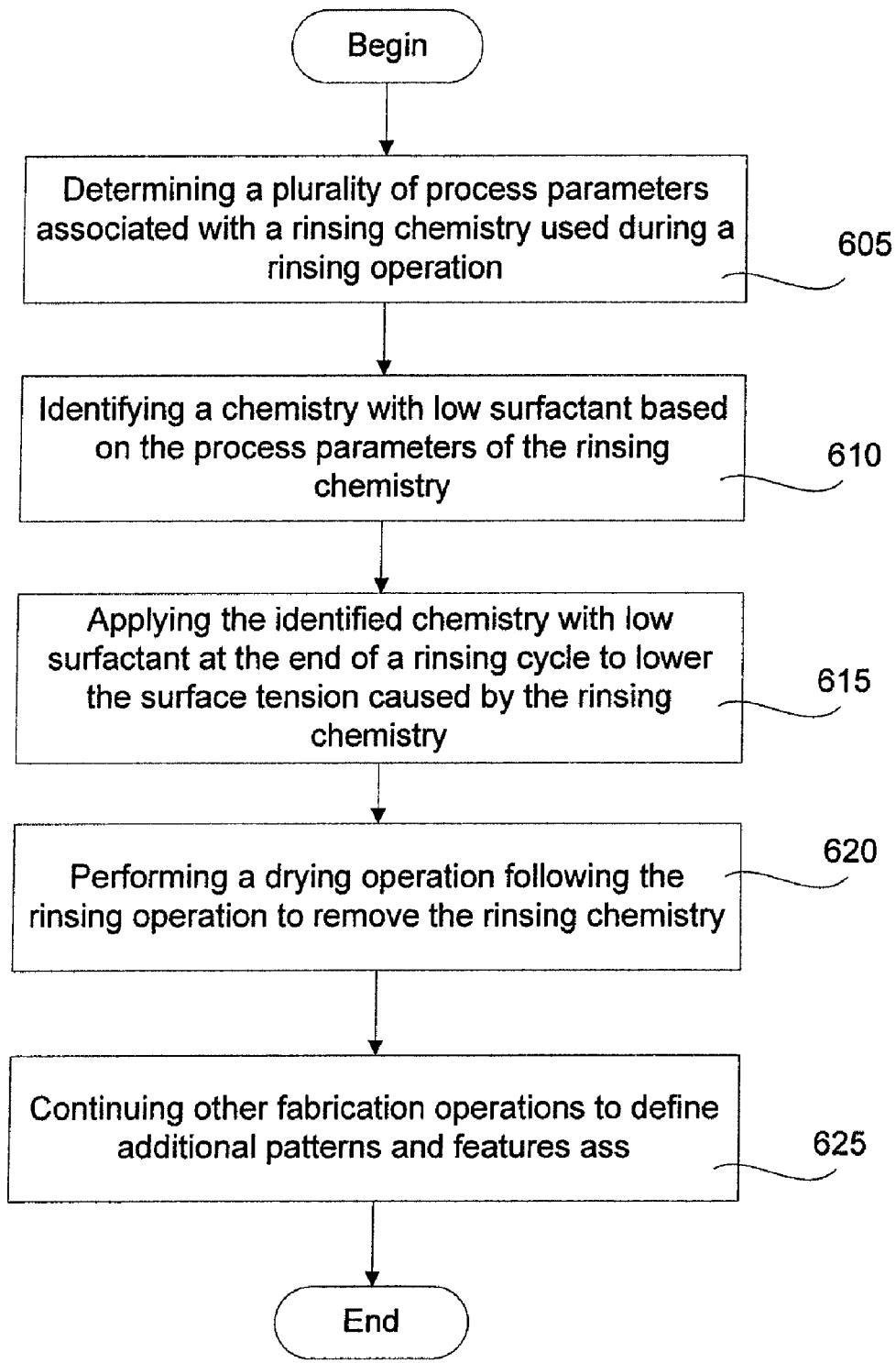
FIG. 6 illustrates the operations involved in applying a chemistry to reduce the surface tension of the rinsing chemistry, during rinsing and drying operation, in one embodiment of the invention.

With the above system configuration in mind, a method for preventing patterns, formed on the surface of the substrate, from collapsing will now be described in detail with reference to FIG. 6. The method begins with identifying a plurality of process parameters associated with the rinsing chemistry used in a rinsing phase of a fabrication operation, as illustrated in operation 605. The process parameters, defining the characteristics of the rinsing chemistry and the substrate surface, may be obtained by analyzing the rinsing chemistry and by analyzing the surface material of the substrate over which the patterns are formed. The process parameters define the characteristics of the rinsing chemistry and the substrate surface so that appropriate chemistry may be used in treating the surface of the substrate without damaging the surface of the substrate or the underlying features.

The method proceeds to operation 610 wherein appropriate chemistry to reduce the surface tension of the rinsing chemistry (surface tension reducer) is identified. The surface tension reducer is chosen such that the surface tension of the rinsing chemistry may be substantially reduced. Some of the surface tension reducer that show promising results include liquid isopropyl alcohol (IPA), mixture of de-ionized (DI) water with liquid IPA, mixture of DI water with hydro fluoroether (HFE) 7100, mixture of DI water with hydro fluorocarbon based surfactants such as DuPont's Zonly surfactant, mixture of DI water with gas such as Nitrogen, Oxygen, Carbon dioxide or inert gases such as Helium, Neon, Argon, Xenon, mixture of high density IPA vapor with Nitrogen, to name a few. Although a list of surface tension reducer used in reducing the surface tension of a rinsing chemistry has been disclosed herein, the list should be considered exemplary and not exhaustive. Other surface tension reducers with low surfactants other than DI water may be used so long as the functionality of the features is maintained.

In operation 615, the selected surface tension reducer is applied to the surface of the substrate at the end of the rinsing cycle, so that the surface tension of the rinsing chemistry is substantially reduced by the low surfactant surface tension reducer. The surface tension reducer is applied by adjusting a plurality of input parameters associated with the surface tension reducer so as to provide optimal surface tension reducer to the surface of the substrate in order to substantially reduce the surface tension of the rinsing chemistry. The input parameters may be adjusted automatically by using a software on a computing system 500 or manually.

Following the application of the surface tension reducer, the surface of the substrate is subjected to a drying operation, as illustrated in operation 620. Due to the low surfactant in the surface tension reducer, the surface tension of the rinsing chemistry is substantially reduced leading to reduced adhesive and cohesive forces leading to reduction in the unbalanced forces. The reduction in the unbalanced forces help in preserving the patterns formed on the substrate. The process continues with operation 625, wherein additional fabrication operations may be performed on the surface of the substrate to define additional patterns of features that define an integrated circuit chip (IC chip). The process may repeat till IC chips are formed on the substrate or some level of fabrication is reached.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for cleaning a substrate having a plurality of patterns formed thereon, comprising:
   providing a proximity head having a plurality of inputs and outputs, the proximity head having a head surface that is placed proximate to a surface of the substrate, using the proximity head,
   (a) applying a rinsing chemistry through a first set of the inputs to the substrate and removing the rinsing chemistry through a first set of the outputs to define a first region of a meniscus having a leading edge and a trailing edge;
   (b) applying surface tension reducing fluid through a second set of the inputs to the substrate and removing the surface tension reducing fluid through a second set of the outputs to define a second region of the meniscus, the surface tension reducing fluid of the second region of the meniscus being applied immediately along side the rinsing chemistry of the first region of the meniscus, such that the rinsing chemistry and the surface tension reducing fluid are removed at a fluid interface through the second set of outputs of the proximity head, the surface tension reducing fluid mixing with the rinsing chemistry to reduce surface tension in and around the plurality of patterns formed on the substrate; and
   (c) applying a nitrogen flow using a third set of inputs defined in the proximity head, the nitrogen flow being introduced immediately along side the surface tension reducing fluid at the trailing edge of the meniscus;
   wherein the substrate is moved under the proximity head in a direction that exposes regions of the substrate first to the leading edge defined by the first region of the meniscus, then to the second region of the meniscus having the surface tension reducing fluid and third to the nitrogen flow at the trailing edge of the meniscus, and wherein the meniscus is defined between the head surface of the proximity head and the surface of the substrate, such that the exposed regions of the substrate exiting the proximity head at the trailing edge are substantially dry upon leaving the region under the proximity head.

2. The method of claim 1, wherein the operations of (a)-(c) are performed simultaneously, so that when the substrate moves under the proximity head, the operations of (a)-(c) operate on the exposed regions consecutively, the exposing to (a) being first and the exposing to (c) being last.

3. The method of claim 1, wherein the surface tension reducing fluid is any one of Isopropyl Alcohol (IPA) or Hydroflouroether (HFE) based chemistry.

4. The method of claim 3, wherein the HFE is a low surfactant chemical.

5. The method of claim 1, wherein the surface tension reducing fluid is any one of liquid IPA, de-ionized water and IPA mixture, high density IPA vapor and Nitrogen mixture, liquid IPA and Nitrogen mixture, mixture of hydro fluorocarbon based surfactant in de-ionized water and de-ionized water and gas.

6. The method of claim 5, wherein the gas includes any one or combination of Nitrogen, Oxygen, Carbon-dioxide, or inert gases including Helium, Neon, Argon, or Xenon.

7. A method for cleaning a substrate having a plurality of patterns formed thereon, comprising:
   providing a proximity head having a plurality of inputs and outputs, the proximity head having a head surface that is placed proximate to a surface of the substrate, using the proximity head,
   (a) applying a rinsing chemistry through a first set of the inputs to the substrate and removing the rinsing chemistry through a first set of the outputs to define a first region of a meniscus having a leading edge and a trailing edge;
   (b) applying surface tension reducing fluid through a second set of the inputs to the substrate and removing the surface tension reducing fluid through a second set of the outputs to define a second region of the meniscus, the surface tension reducing fluid of the second region of the meniscus being applied immediately along side the rinsing chemistry of the first region of the meniscus, such that the rinsing chemistry and the surface tension reducing fluid are removed at a fluid interface through the second set of outputs of the proximity head, the surface tension reducing fluid mixing with the rinsing chemistry to reduce surface tension within the plurality of patterns formed on the substrate; and
   (c) applying a drying gas using a third set of inputs defined in the proximity head, the drying gas being introduced immediately along side the surface tension reducing fluid at the trailing edge of the meniscus;
   wherein the substrate is moved under the proximity head in a direction that exposes regions of the substrate first to the leading edge of the meniscus defined by the first region having the rinsing chemistry then to the second region of the meniscus having the surface tension reducing fluid and third to the drying gas at the trailing edge of the meniscus,
   wherein the meniscus is defined between the head surface of the proximity head and the surface of the substrate with the applied rinsing chemistry and the applied surface tension reducing fluid, the drying gas acting to substantially dry the exposed regions of the substrate exiting the proximity head at the trailing edge.

8. The method of claim 7, wherein the removing through the second set of outputs is assisted by vacuum.

9. The method of claim 7, wherein the operations of (a)-(c) are performed simultaneously, so that when the substrate moves under the proximity head, the operations of (a)-(c) operate on the exposed regions consecutively, the exposing to (a) being first and the exposing to (c) being last.

10. The method of claim 7, wherein the surface tension reducing fluid is any one of Isopropyl Alcohol (IPA) or Hydroflouroether (HFE) based chemistry.

11. The method of claim 10, wherein the HFE is a low surfactant chemical.

12. The method of claim 7, wherein the surface tension reducing fluid is any one of liquid IPA, de-ionized water and IPA mixture, high density IPA vapor and Nitrogen mixture, liquid IPA and Nitrogen mixture, mixture of hydro fluorocarbon based surfactant in de-ionized water and de-ionized water and gas.

13. The method of claim 12, wherein the gas includes any one or combination of Nitrogen, Oxygen, Carbon-dioxide, or inert gases including Helium, Neon, Argon, or Xenon.

14. The method of claim 7, wherein the drying gas is Nitrogen.

* * * * *